US005261970A

United States Patent [19]

Landis et al.

[11] Patent Number: 5,261,970

[45] Date of Patent: Nov. 16, 1993

[54] OPTOELECTRONIC AND PHOTOVOLTAIC DEVICES WITH LOW-REFLECTANCE SURFACES

[75] Inventors: Geoffrey A. Landis, Brook Park; Phillip P. Jenkins, Cleveland Heights, both of Ohio

[73] Assignee: Sverdrup Technology, Inc., Tullohoma, Tenn.

[21] Appl. No.: 865,072

[22] Filed: Apr. 8, 1992

[51] Int. Cl.[5] .................. H01L 31/0236; H01L 31/18

[52] U.S. Cl. .................................. 136/259; 136/252; 257/436; 437/2; 437/5

[58] Field of Search ....................... 136/252, 256, 259; 257/436-437; 437/2-5

[56] References Cited

U.S. PATENT DOCUMENTS

| | | | |
|---|---|---|---|
| 3,973,994 | 8/1976 | Redfield | 136/259 |
| 4,072,541 | 2/1978 | Meulenberg, Jr. et al. | |
| 4,143,234 | 3/1979 | Johnson et al. | 136/259 |
| 4,360,701 | 11/1982 | Evans, Jr. | 136/259 |
| 4,419,533 | 12/1983 | Czubatyj et al. | 136/259 |
| 4,608,451 | 8/1986 | Landis | 136/256 |
| 4,620,364 | 11/1986 | Landis | 437/2 |
| 4,644,091 | 2/1987 | Hayashi et al. | 136/259 |
| 4,953,030 | 6/1984 | David et al. | 136/256 |
| 5,076,857 | 12/1991 | Nowlan | 136/256 |
| 5,080,725 | 1/1992 | Green et al. | 136/256 |

FOREIGN PATENT DOCUMENTS

| | | | |
|---|---|---|---|
| 60-22380 | 2/1985 | Japan | 136/256 |

OTHER PUBLICATIONS

P. Verlinden et al., *Solar Energy Mat'ls & Solar Cells,* vol. 26, pp. 71-78, Mar. 1992.

A. Rothwarf, *Conf. Record, 18th IEEE Photovoltaic Specialists Conf.,* (Oct. 1985), pp. 809-812.

M. A. Green et al., *Conf. Record, 19th IEEE Photovoltaic Specialists Conf.,* (May 1987), pp. 912-917.

N. M. Bordina et al., *Geliotekhnika,* vol. 8, No. 3, pp. 6-11 (1982).

P. Campbell, *Solar Energy Mat'ls,* vol. 21, pp. 165-172, Dec. 1990.

J. A. Rand et al., *Conf. Record, 21st IEEE Photovoltaic Specialists Conf.,* May 1990, pp. 263-268.

Landis, *A Light-Trapping Solar Cell Coverglass,* 21st Photovoltaic Specialists Conference, May 1990, vol. 2, pp. 1304-1307 (1990).

Redfield, D., *Multiple-pass Thin Film Silicon Solar Cell,* Applied Physics Letters, vol. 25, No. 11, pp. 647-648 (1974) (Dec.).

Bailey et al., *Application of V-Groove Technology to InP Solar Cells,* 2nd Inf. Conference InP, pp. 73-79.

Haynos et al., *The Comsat Non-Reflective Solar Cell: A Second Generation Improved Cell.*

Roedel et al., *The Design of Anistropically Etched III-V Solar Cells,* Solar Cells, 11, pp. 221-239.

Green et al., *Recent Advances in High Efficiency Silicon Solar Cells,* 19th Photovoltaic Specialists Conf., IEEE, (1987), (May), pp. 6-12.

Adachi et al., *Chemical Etching Characteristics of (001) InP,* J. Electrochem. Soc., vol. 128 No. 6, pp. 1342-1349, (1981), (Jun.).

Tuck et al., *Chemical Etching of (III) and (100) Surfaces of InP,* Journal of Materials Science, vol. 8, pp. 1559-1566 (1973).

Hua et al., *InP Etch Pit Morphologies Revealed by Novel HCI-Based Etchants,* J. Electrochem. Soc., vol. 136, No. 6, (1989), Jun., pp. 1804-1806.

*Primary Examiner*—Aaron Weisstuch

*Attorney, Agent, or Firm*—Watts Hoffmann Fisher & Heinke

[57] ABSTRACT

Low angle V-grooves are provided in the target surfaces of optoelectronic or photovoltaic devices such as solar cells and photodetectors. The low angle V-grooves increase the efficiency of the devices by promoting total internal reflection of light reflected from the target surface at the interface of the coverglass and the external environment.

19 Claims, 2 Drawing Sheets

22 34 30 30 26' 28' 26 28 22 24 24 12 20 38 12 32 14 16 16 14 18

OPTOELECTRONIC AND PHOTOVOLTAIC DEVICES WITH LOW-REFLECTANCE SURFACES

The invention described herein was made in performance of work under NASA Contract No. NAG3-658, and is subject to the provision of 305 of the National Aeronautics and Space Act of 1958, as amended, (42 U.S.C. § 2457).

FIELD OF THE INVENTION

The invention relates to improved optoelectronic and photovoltaic devices such as solar cells and photodetectors. More specifically, the invention features novel textures for the target surfaces of such devices that improve the efficiency of the devices by promoting total internal reflection at the interface of a coverglass and the external environment.

BACKGROUND OF THE INVENTION

Reducing the surface reflection from the surfaces of optoelectronic and photovoltaic devices such as solar cells and photodetectors is of significant interest since these devices have many important applications. Solar cells are now the main power source used for satellites, and future plans for expanded telecommunications will require large amounts of power in space. Similarly, solar cells for the generation of electrical power on Earth are an important nonpolluting renewable energy source.

Currently, several techniques are used for reducing the surface reflection from semiconductor layers used in optoelectronic and photovoltaic devices. One such technique is the use of antireflection (AR) coatings. AR coatings, however, only reduce reflection to a limited extent and only in a narrow wavelength range.

Surface texturization processes have been used to reduce surface reflection from silicon, but have the drawback of increasing the junction and front surface areas, which increases the amount of dark or leakage current associated therewith. Moreover, most known surface texturizations are applicable primarily to silicon, and do not work well on compound semiconductors. In this regard, high angle V-grooves have been produced in the semiconductor surfaces to reduce reflection from the cells. A high angle V-groove reduces reflection from the cell by causing the light incident on one wall surface to reflect into the adjacent wall surface of the V-groove. High angle V-grooves, as noted above, have the drawback of increasing surface area which decreases the efficiency of a solar cell because of losses due to dark current. High angle V-grooves are also prone to shorting and junction shunting which also decreases the efficiency and processing yield. Furthermore, existing processes for forming high-angle V-grooves require a masking step to delineate the grooves during fabrication. This process adds to the cost and complexity of the fabrication process.

Solar cells are commonly encapsulated with a coverglass for protection from environmental degradation. One process proposes using light trapping in the coverglass to reduce reflection from the cell. This process requires the glass cover to be textured. The structure of the coverglass does not, however, allow the complete recovery of reflected light. Yet another structure proposes a system of grooves on the back of a silicon cell. This structure does not reduce front surface reflection, nor does it recover light reflected from front surface metallization.

SUMMARY OF THE INVENTION

The invention relates to improving the efficiency of optoelectronic devices such as solar cells and photodetectors by reducing surface reflection thereby allowing the device to capture more energy. The invention advantageously reduces reflection over the full spectrum and is thus an improvement over the use of AR coatings alone. When AR coatings are used in conjunction with the invention the efficiency of the cell is even further enhanced. Moreover, the invention enables the recovery of losses due to light reflection from front-surface metallization.

It is therefore an object of the invention to provide an improvement in an optoelectronic or photovoltaic device having an encapsulated semiconductor surface. The improvement comprises forming low angle V-grooves having wall surfaces inclined at an angle with respect to a plane parallel to the surface interface of the coverglass, sufficient to promote total internal reflection of normally incident light reflected therefrom at the coverglass-air or coverglass-vacuum interface.

More preferably, it is an object of the invention to provide an optoelectronic or photovoltaic device comprising a target layer having a target surface elongated in two dimensions which define a reference plane and a light transparent layer having a planar exposed surface interface parallel to the reference plane and an opposite surface complementary to the target surface for forming a continuous interface between the target layer and the light-transparent layer. The target surface includes low angle V-grooves bounded by wall surfaces inclined at an angle no greater than 30° from the reference plane to promote total internal reflection at the planar exposed surface interface. In a preferred embodiment, the V-grooves are elongated in a dimension parallel to the reference plane and have elevation angles greater than half the measure of a critical angle of the light transparent layer. Still more preferably, the target layer is comprised of indium phosphide, or of a semiconductor device made on an indium phosphide substrate.

It is yet another object of the invention to provide a method of making an improved indium phosphide semiconductor surface for use in optoelectronic or photovoltaic devices comprising etching the indium phosphide surface with concentrated HCl for about 15 minutes without masking to form the grooves.

Many additional features, advantages and a fuller understanding of the invention will be had from the following detailed description of the preferred embodiments and the accompanying drawings.

DETAILED DESCRIPTION OF THE INVENTION

In the present invention, light reflected from one wall surface of a V-groove face is reflected by total internal reflection (TIR) from the coverglass-air or coverglass-vacuum interface, and redirected back to the grooved surface for absorption by the semiconductor layer. While the surface interface of the coverglass is typically a coverglass-air or coverglass-vacuum interface, the term as used herein is intended to mean the interface of the coverglass with any external environment with which the coverglass might interface. For the total internal reflection to occur at this interface the angle of the light ray to the interface (measured from the normal) must be greater than the critical angle $\Phi_c$, which is related to the index of refraction n of a given material by the formula:

$$\Phi_c = \mathrm{Sin}^{-1} 1/n \qquad \text{I}$$

Figure 1:
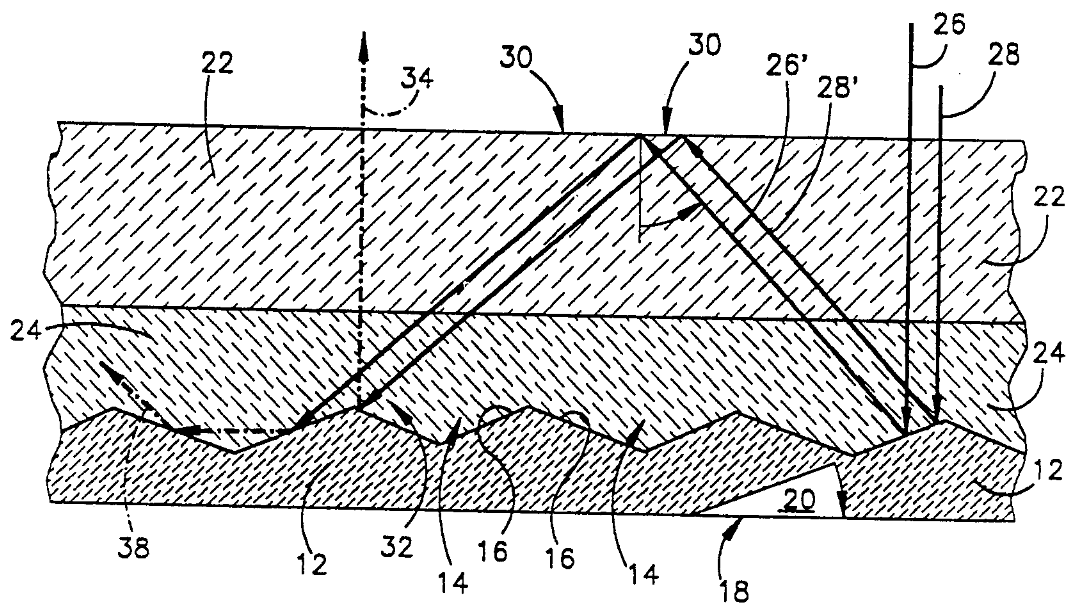
FIG. 1 is a diagrammatic cross-sectional view of a grooved solar cell according to the invention showing a light path in the cell and the total internal reflection thereof.

When the coverglass is secured to the grooved surface by a light transmissive adhesive, the relevant index of refraction is that of the adhesive and in the case where the coverglass is bonded to the semiconductor surface without an adhesive, that of the coverglass itself. While the indices of the coverglass and adhesive in the cell of FIG. 1 are matched to simplify the ray tracing, index matching is not necessary. In some applications it may even be desirable to use an adhesive with an index of refraction greater than that of the coverglass. The typical index of refraction for such materials is in the range of 1.35 to 1.5, but may be as high as 1.7 for some of the high index adhesives.

For a ray reflected from the target surface to reach the surface interface at the required angle, the minimum groove angle (as measured from a plane parallel to the surface interface) must be at least half the critical angle according to the formula:

$$\Theta_{groove} \geqq \tfrac{1}{2}\, \mathrm{Sin}^{-1} 1/n \qquad \text{II}$$

The maximum groove angle to be considered a low angle V-groove according to the invention is 30° as measured from a plane parallel to the surface interface. If the groove angle is 45° or higher all of the light reflected from one wall surface of a groove will be directed onto the opposing wall surface of the groove. The prior methods described above use these high angle V-grooves and thus encounter the problem of shorting and junction shunting. Conversely, if the wall surface of a groove is inclined from a plane parallel to the surface interface at an angle no greater than 30°, none of the light reflected from one wall surface of a groove will be reflected to the opposing wall surface of the groove. For groove angles greater than the minimum defined above, but less than 30° the reflected light will be directed in a direction toward the surface interface of the coverglass so as to reach the coverglass-air or coverglass-vacuum interface at an angle at least as great as the critical angle and hence be totally internally reflected. A wall surface angle between 30° and 45° will yield a combination of reflections, some toward the surface interface and some into adjacent groove surfaces.

As noted above, the low angle V-grooves of the invention significantly decrease the net reflection from the cell by promoting total internal reflection from the surface interface back to the semiconductor surface of the cell. This improvement can be compounded when used in conjunction with antireflective (AR) coatings. AR coatings commonly used on the surface of solar cells in the art include the $ZnS/MgF_2$ multilayer coating, as well as other materials such as $TiO_2$, $Ta_2O_5$, $Si_3N_4$, SiO, $SiO_2$, $Al_2O_3$, ITO, and multilayer combinations thereof. Any of these materials, or other materials of similar effect known to those of ordinary skill in the art, can be used in conjunction with the low angle V-grooves of the invention. In addition, the outside surface of the coverglass may also be coated with an antireflective coating. Typically, $MgF_2$ is used for this application.

It is to be understood that the term coverglass as used herein means any transparent or nearly transparent material affixed to the light-absorbing surface of the semiconductor. The coverglass need not be made of glass and may be selected from other materials including silicone, acrylic, Teflon and the like. For space craft, the coverglass is often glass, more specifically, fused silica or ceriadoped silica.

The invention is of particular interest for increasing the efficiency of a photovoltaic device, often referred to as a "solar cell". In a solar cell, light is incident on an absorbing semiconductor layer. An electronic junction is formed in or on the semiconductor material for the purpose of separating the charge pair created by the incident light. This junction may be of any of several types, including a p-n junction, a semiconductor heterojunction, such as that formed by a surface layer of indium-tin oxide (ITO) on a p-type semiconductor, or a Schottky-barrier. These junction types are well know to those of ordinary skill in the art. A solar cell further has metal contact layers to form the positive and negative electrical contacts to the semiconductor. Often one of the electrical contacts is made to the light-absorbing surface of the semiconductor, and in this case provision must be made for light to enter the cell. This is conventionally done by making this a "grid" contact, with open spaces for light to enter the semiconductor.

FIG. 1 shows the theoretical ray tracing and total internal reflection promoted by the low angle V-grooves of a cell according to the invention. The cell 10 (not drawn to scale) is comprised of an Indium Phosphide (InP) semiconductor layer 12 having low angle V-grooves 14 disposed therein. The V-grooves 14 have semiconductor wall surfaces 16 inclined from the reference plane 18 at an angle of about 23.2° shown at angle 20. A coverglass 22 is disposed on the semiconductor layer 12 and secured there by a light transmissive adhesive layer 24. The indices of refraction of the adhesive layer and coverglass are matched for this cell.

Normally incident light rays 26, 28 enter the cell through coverglass 22 and pass directly to the semiconductor wall surfaces 16. When no AR coating is used, approximately 19% of the incident light is reflected from the semiconductor surfaces 16, shown as reflected rays 26', 28'. Since the angle of incidence and the angle of reflection are symmetrical, the reflected rays 26', 28' are reflected from the surface at an angle of approximately 46.6° from the normal of the cell. Reflected rays 26', 28' will therefore arrive at the coverglass surface interface 30 at an angle of 46.6°, which is greater than the critical angle, which for this material having an index of refraction of 1.41 is 40.6° according to formula I. Therefore, reflected rays 26', 28' will be totally internally reflected (TIR) at the interface 30 back toward the semiconductor surface.

Approximately 75% of the totally internally reflected light will return to the semiconductor surface at an angle of 46.6° as shown by reflected ray 28' and contact the surface at an angle of 66.8° with respect thereto as shown by angle 32. As a result, the remaining unabsorbed portion of this ray, only about 2.7% based on the 100% of normally incident light, will be reflected back toward the surface at an angle less than the critical angle and thus pass out of the cell, as shown by ray 34. Approximately 25% of the totally internally reflected light will return to the semiconductor surface, also at an angle of 46.6°, but will contact the surface at an angle of 136.4° with respect thereto. The remaining unabsorbed light from this ray will ultimately be totally internally reflected indicated at ray 38. While the figure shows all of the grooves as having the same angle from the reference plane, it is to be understood that the invention does not require all the grooves to be at the same angle, as long as each groove is angled to within the constraints discussed above.

Figure 2:
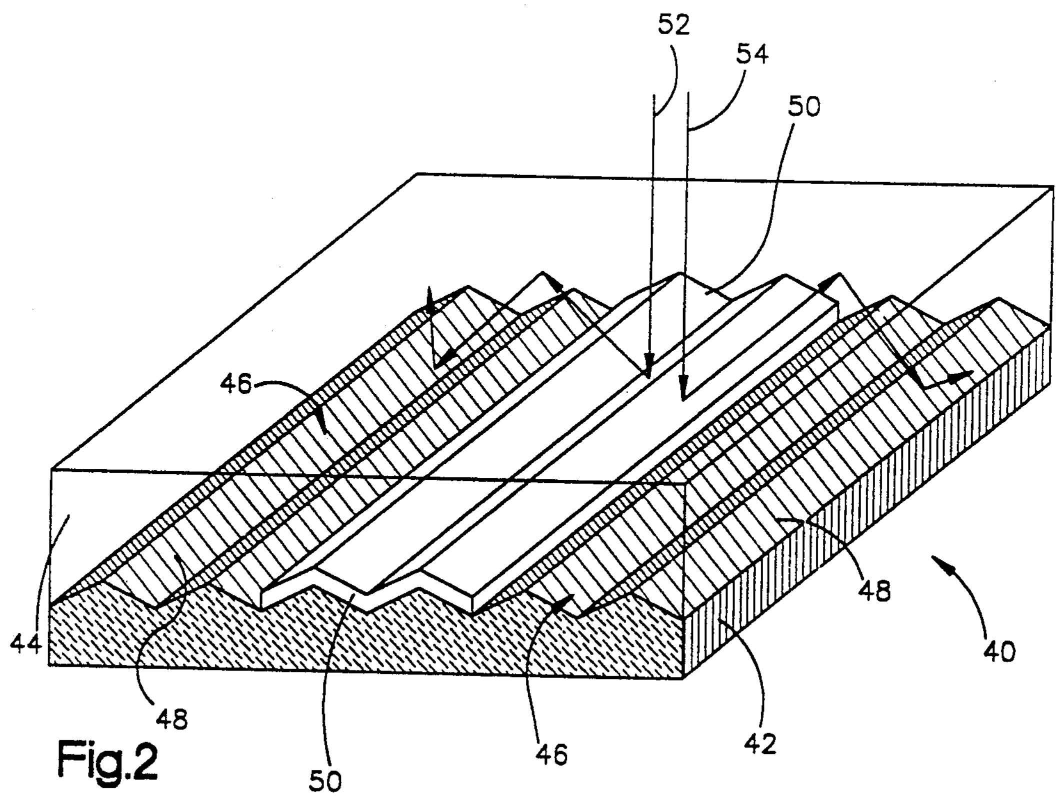
FIG. 2 is a diagrammatic perspective view of a grooved solar cell according to the invention showing the recapture of light reflected due to front surface metallization.

FIG. 2 demonstrates the advantages of the principle described above as it applies to the problem of reflection from front surface metallization. FIG. 2 shows a cell 40 having an InP semiconductor layer 42 and a coverglass 44. Disposed in the surface of the semiconductor layer are low angle V-grooves 46 having wall surfaces 48. Also disposed on the surface of the semiconductor layer 42 is an electrode grid finger 50 which conforms to the contours of the low angle V-grooves 46 on the surface of the semiconductor.

In the typical situation where no V-grooves are used, light contacting the grid fingers of the front surface metallization is reflected out of the cell and lost. Consequently, the amount of front surface metallization, i.e., the number and area of grid fingers, that can be used in the cell is limited because of the power decreased associated with too much reflection from the metallization. However, by employing the low angle V-grooves of the instant invention most of the light reflected from the grid fingers will be totally internally reflected at the surface interface as shown by normally incident rays 52, 54 in FIG. 2. Due to total internal reflection, most of the light reflected by front surface metallization will eventually contact the surfaces of the semiconductor 42 and will be absorbed. Therefore, the invention enables the amount of front surface metallization to be increased without sacrificing significant amounts of power, resulting in lower resistance and hence, higher power.

The low angle V-grooves of the invention are particularly suitable for cells employing Indium Phosphide (InP) as the semiconductor layer because the inventors have surprisingly discovered that suitable grooves can be easily forme in InP by a simple maskless anistropic etching process. In the process, InP wafers are simply etched in a bath of concentrated HCl for approximately 15 minutes. No external agitation is necessary. For optimum results the etching should take place at temperature of about 15°–20° C. If the temperature is too high, the etching starts to become isotropic. If the temperature is too low the etch will still be anisotropic, but the process takes longer. Moreover, for optimum results the HCl should be concentrated, preferably at least about 36% assay. The advantages and a fuller understanding will be had from the following non-limiting example.

EXAMPLE

A low angle V-grooved Indium Phosphide surface was prepared by a simple maskless anisotropic etching process wherein a (100) InP wafer was etched in concentrated HCl (assay 37%) at 17° C. in room light for 15 minutes without external agitation. In the process, nearly 100 microns of InP was removed. The grooves formed had a periodicity of about 2.4 microns from peak to peak and nearly smooth walls. The grooves run axially along the (011) direction. Surface reflectance measurements showed the average groove angle to be about 23.2°, with variation of about ±2.5°. This is close to the (311) plane which has a theoretical angle of 25.24° to the (100) plane.

An Indium-tin oxide/InP solar cell was prepared with the low angle V-grooved wafer having a fused silica coverglass adhered to the InP surface using Dow Corning 93-500 silicone adhesive, a standard space coverglass adhesive with a refractive index of 1.41. Likewise, the refractive index of the coverglass was 1.41.

Figure 3:
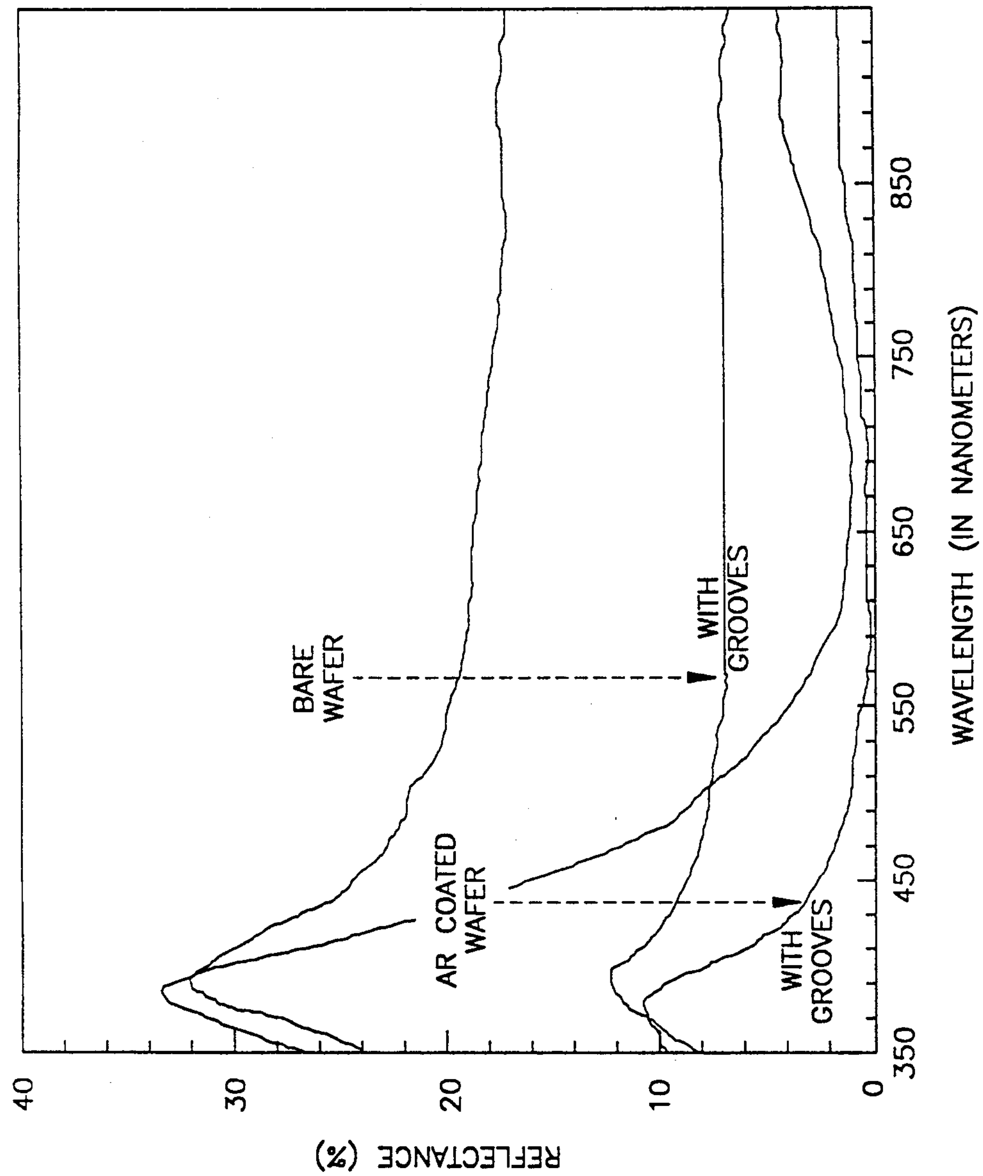
FIG. 3 is a plot of reflectance versus wavelength comparing both uncoated and AR coated cells with and without the low angle V-grooves of the invention.

Optical reflectance as a function of wavelength was measured at 6° incidence using a Perkin-Elmer Lambda-9 spectrophotometer. FIG. 3 shows the reflectance of coverglass encapsulated InP surface with and without the low angle V-grooves as measured by the spectrophotometer. The reflectance of the grooved surface is 7–8% which, as can be seen, is a significant improvement over having no low angle V-grooves.

Many modifications and variations of the invention will be apparent to those skilled in the art in light of the foregoing detailed disclosure. Therefore, within the scope of the appended claims, the invention can be practiced otherwise than as specifically shown and described.

What is claimed is:

1. An optoelectronic device comprising:

a) a semiconductor device having a front surface for absorption of light;

b) a light-transparent material affixed to the front surface; and, c) a multiplicity of low-angle V-grooves formed on said front surface bounded by wall surfaces having a maximum angle of 30° as measured from a plane parallel to said front surface to promote total internal reflection from said light transmissive material.

2. The device according to claim 1 wherein the optoelectronic device is an indium phosphide solar cell having an electronic junction for collection of generated charge and front and rear surface metallization for electrical contact.

3. An optoelectronic or photovoltaic device comprising:

a) a target layer having a target surface elongated in two dimensions which define a reference plane; and, b) a light transparent layer having a planar exposed surface interface parallel to the reference plane and an opposite surface complementary to the target surface for forming a continuous interface between the target layer and the light transparent layer;

c) wherein the target surface includes low angle V-grooves bounded by wall surfaces inclined at an angle no greater than 30° from the reference plane to promote total internal reflection at the planar exposed surface interface.

4. A device according to claim 3 wherein the wall surfaces bounding the V-grooves are inclined at an angle greater than half the measure of a critical angle of the light transparent layer.

5. A device according to claim 3 wherein the target layer is comprised of Indium Phosphide.

6. A device according to claim 3 wherein the light transparent layer is coupled to the target layer by a light transparent adhesive having an index of refraction matched to the index of refraction of the transparent layer.

7. A device according to claim 6 wherein the light transparent layer comprises a material selected from the group consisting of glass and fused silica.

8. A device according to claim 6 wherein the transparent adhesive is a silicone adhesive.

9. An optoelectronic or photovoltaic device comprising:

a) a target layer having a target surface elongated in two dimensions which define a reference plane;

b) an adhesive layer disposed on the target surface to form a continuous interface; and, c) a light transparent layer coupled to the adhesive layer and having a planar exposed surface interface parallel to the reference plane;

d) wherein the target surface includes V-grooves elongated in a dimension parallel to the reference plane having wall surfaces inclined at an angle greater than half the measure of a critical angle of the light transparent layer, and no greater than 30° from the reference plane to promote total internal reflection from said planar exposed surface interface.

10. A device according to claim 9 furthér comprising an antireflective coating disposed on said target surface.

11. An improvement in an optoelectronic or photovoltaic device having a semiconductor surface elongated in two dimensions which define a reference plane and a coverglass secured to said surface by a light transmissive adhesive, said coverglass having a planar surface parallel to said reference plane at an air or vacuum interface, the improvement wherein said semiconductor surface includes low angle V-grooves bounded by wall surface inclined at an angle with respect to said reference plane sufficient to promote total internal reflection of normally incident light reflected therefrom at the coverglass-air or coverglass-vacuum interface.

12. The improvement according to claim 11 wherein said device has a semiconductor surface comprised of indium phosphide.

13. The improvement according to claim 11 wherein said device further includes an antireflective coating.

14. The improvement according to claim 11 wherein said coverglass is comprised of fused silica and said adhesive is a silicon based adhesive.

15. The improvement according to claim 12 wherein said low angle V-grooves have facets which correspond approximately to the (311) plane of said indium phosphide.

16. A method of making an optoelectronic or photovoltaic device comprising:

a) forming a flat surface on a target material oriented in two dimensions which define a reference plain;

b) forming V-grooves in said flat surface with wall surfaces inclined at an angle no greater than 30° from a plane parallel to the flat surface; and, c) coupling a light transparent cover to the V-grooved surface of said target material by means of a light transmissive adhesive.

17. The method according to claim 16 wherein said V-grooves are formed in said flat surface by maskless etching.

18. A product formed according to the process of claim 16.

19. A method of making an improved low reflectance surface for use in an optoelectronic or photovoltaic device comprising:

a) forming low angle V-grooves in a flat surface of a target material having wall surfaces inclined at an angle no greater than 30° from a plane parallel to the flat surface; and, c) coupling a light transparent cover to the V-grooved surface of said target material.

* * * * *